(12) United States Patent
Lee

(10) Patent No.: US 12,727,170 B2
(45) Date of Patent: Sep. 1, 2026

(54) SEMICONDUCTOR DEVICE AND METHOD OF MANUFACTURING THE SEMICONDUCTOR DEVICE

(71) Applicant: SK hynix Inc., Icheon (KR)

(72) Inventor: Woo Tae Lee, Icheon (KR)

(73) Assignee: SK hynix Inc., Icheon (KR)

( * ) Notice: Subject to any disclaimer, the term of this patent is extended or adjusted under 35 U.S.C. 154(b) by 305 days.

(21) Appl. No.: 18/447,196

(22) Filed: Aug. 9, 2023

(65) Prior Publication Data

US 2024/0341104 A1 Oct. 10, 2024

(30) Foreign Application Priority Data

Apr. 6, 2023 (KR) ........................ 10-2023-0045254

(51) Int. Cl.
*H10B 63/00* (2023.01)

(52) U.S. Cl.
CPC .................................... *H10B 63/80* (2023.02)

(58) Field of Classification Search
CPC ........ H10B 63/80; H10B 63/84; H10N 70/20; H10N 70/231; H10N 70/826; H10N 70/8833; H10N 70/011; H10N 70/063; H10N 70/841; H10N 70/021; H10N 79/00
See application file for complete search history.

(56) References Cited

U.S. PATENT DOCUMENTS

| | | | | |
|---|---|---|---|---|
| 9,130,167 | B2 * | 9/2015 | Murase | H10N 70/8833 |
| 9,502,103 | B1 * | 11/2016 | Tanimoto | H10B 63/34 |
| 9,577,010 | B2 | 2/2017 | Sciarrillo | |
| 10,374,008 | B2 * | 8/2019 | Seong | H10B 63/845 |
| 10,547,000 | B2 * | 1/2020 | Jeong | H10N 70/8828 |
| 10,636,968 | B2 * | 4/2020 | Horii | H10B 63/84 |
| 10,720,211 | B2 * | 7/2020 | Kim | G11C 14/0045 |
| 10,748,965 | B2 * | 8/2020 | Miyazaki | H10B 63/80 |
| 11,171,287 | B2 * | 11/2021 | Kim | H10N 70/231 |
| 2013/0295745 | A1 * | 11/2013 | Takahashi | H10N 70/24 438/382 |
| 2014/0312293 | A1 * | 10/2014 | Mikawa | H10N 70/8416 257/4 |
| 2018/0358056 | A1 * | 12/2018 | Lee | G11C 5/06 |
| 2021/0028232 | A1 * | 1/2021 | Han | G11C 13/0002 |
| 2021/0036056 | A1 * | 2/2021 | Park | H10B 63/80 |
| 2021/0151505 | A1 * | 5/2021 | Han | H10N 70/231 |

FOREIGN PATENT DOCUMENTS

| | | |
|---|---|---|
| KR | 1020170098580 A | 8/2017 |
| KR | 1020220037000 A | 3/2022 |

* cited by examiner

*Primary Examiner* — Caleb E Henry

(57) ABSTRACT

A semiconductor device may include a word line that extends in a first direction, a bit line that extends in a second direction that intersects the first direction, a variable resistance pattern that is disposed between the word line and the bit line and that has a first width in the first direction and a second width in the second direction, wherein the first width and the second width are different from each other, and an electrode pattern that is disposed between the variable resistance pattern and the bit line and that has a third width in the first direction and a fourth width in the second direction, wherein the third width and the fourth width are different from each other.

13 Claims, 30 Drawing Sheets

SEMICONDUCTOR DEVICE AND METHOD OF MANUFACTURING THE SEMICONDUCTOR DEVICE

CROSS-REFERENCE TO RELATED APPLICATION

This application claims priority under 35 U.S.C. § 119 to Korean Patent Application No. 10-2023-0045254 filed on Apr. 6, 2023, which is incorporated herein by reference in its entirety.

BACKGROUND

1. Technical Field

Embodiments relate to an electronic device and a method of manufacturing the electronic device and, more particularly, to a semiconductor device and a method of manufacturing the semiconductor device.

2. Related Art

The degree of integration of semiconductor devices is basically determined by an area that is occupied by a unit memory cell. As the improvement of the degree of integration of semiconductor devices in which a memory cell is formed on a substrate as a single layer recently reaches its limit, a three-dimensional semiconductor device in which memory cells are stacked on a substrate is proposed. Furthermore, in order to improve operation reliability of such a semiconductor device, various structures and manufacturing methods are developed.

SUMMARY

In an embodiment, a semiconductor device may include a word line that extends in a first direction; a bit line that extends in a second direction that intersects the first direction; a variable resistance pattern disposed between the word line and the bit line in a third direction that is perpendicular to the first and the second directions, the variable resistance pattern having a first width in the first direction and a second width in the second direction, wherein the first width and the second width are different from each other; and an electrode pattern disposed between the variable resistance pattern and the bit line in the third direction, the electrode pattern having a third width in the first direction and a fourth width in the second direction, wherein the third width and the fourth width are different from each other.

In an embodiment, a method of manufacturing a semiconductor device may include forming a first conductive layer; forming a variable resistance layer over the first conductive layer in a third direction; forming an electrode layer on the variable resistance layer in the third direction; forming electrode lines that extend in a first direction by etching the electrode layer; forming variable resistance lines with first recesses that extend in the first direction by etching the variable resistance layer, the first recesses disposed on sidewalls of the variable resistance lines to face the variable resistance lines in a second direction, the second direction intersecting the first direction, the third direction being perpendicular to the first and the second directions; forming first conductive lines that extend in the first direction by etching the first conductive layer; forming a second conductive layer on the electrode lines; forming second conductive lines that extend in the second direction by etching the second conductive layer; and forming electrode patterns with second recesses by etching the electrode lines, the second recesses disposed on sidewalls of the electrode patterns to face the electrode patterns in the first direction.

DETAILED DESCRIPTION

Hereinafter, embodiments according to the technical spirit of the present disclosure are described with reference to the accompanying drawings.

Embodiments of the present disclosure provide a semiconductor device having a stable structure and improved characteristics and a method of manufacturing the semiconductor device.

According to the present technology, the semiconductor device having the stable structure and improved reliability can be provided.

Figure 1A:
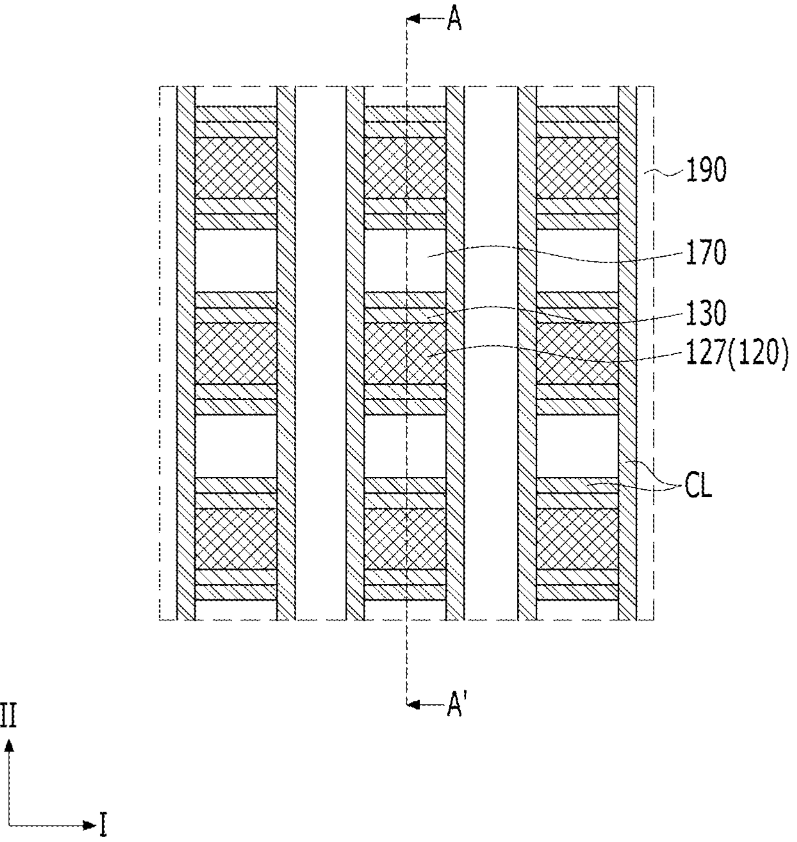
FIGS. 1A to 1E illustrate a semiconductor device according to an embodiment of the present disclosure.
Figure 1B:
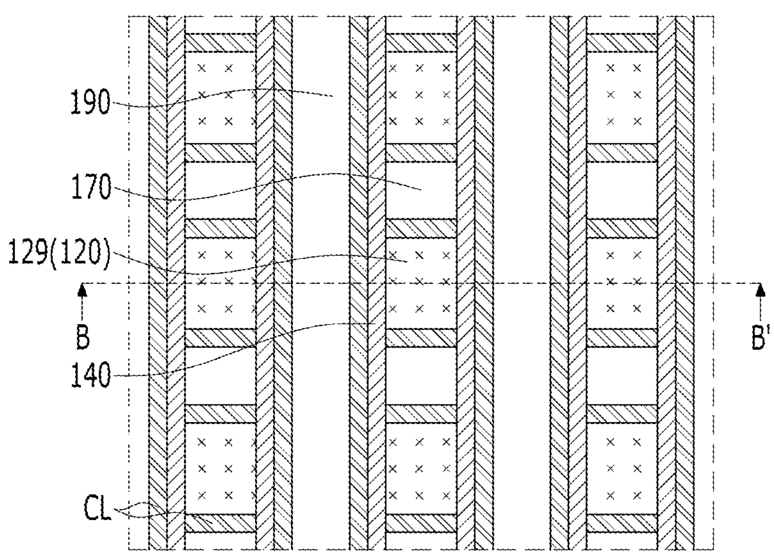
Figure 1B:
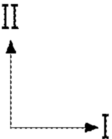
Figure 1C:
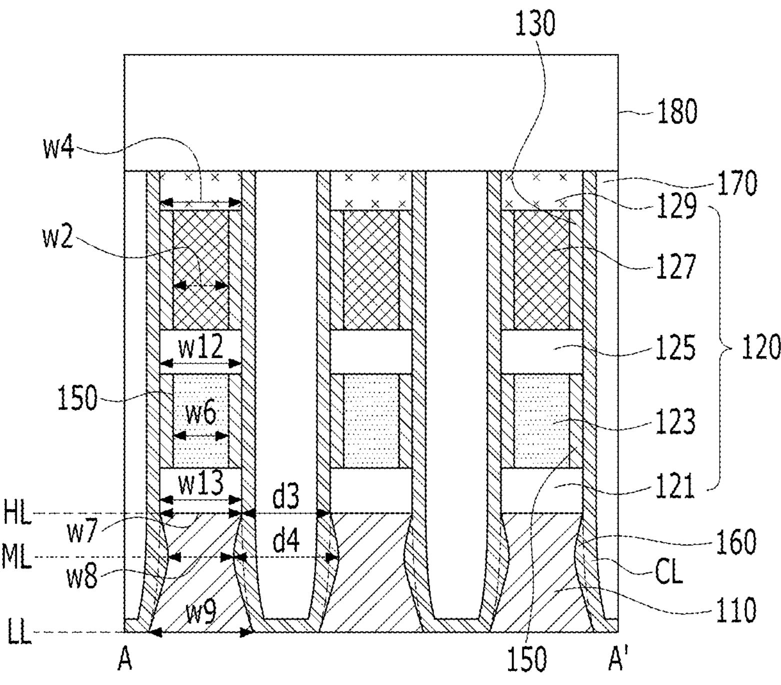
Figure 1C:
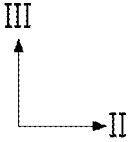
Figure 1D:
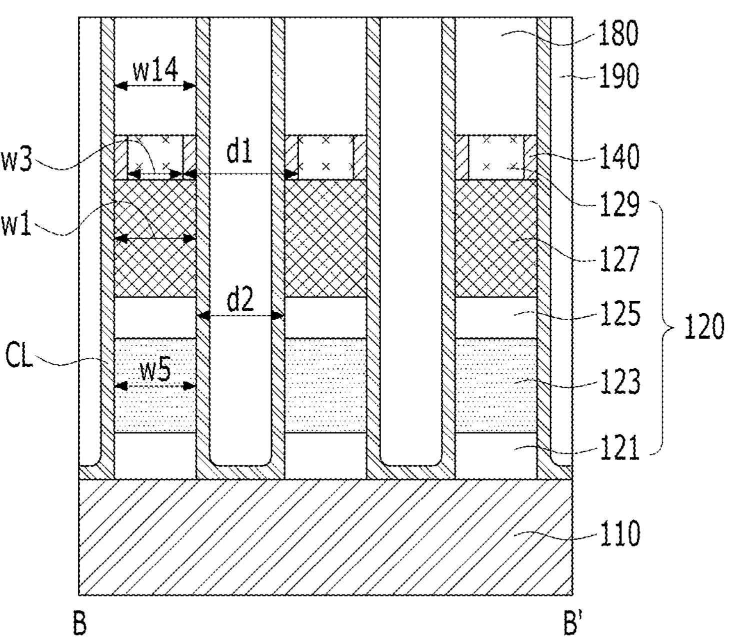
Figure 1D:
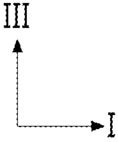
Figure 1E:
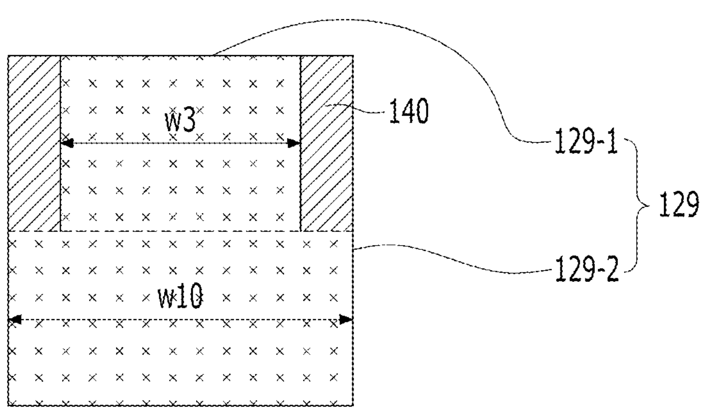

FIGS. 1A to 1E illustrate a semiconductor device according to an embodiment of the present disclosure. FIGS. 1A and 1B are plan views of the semiconductor device. FIG. 1C is a cross-sectional view taken along line A-A' in FIG. 1A. FIG. 1D is a cross-sectional view taken along line B-B' in FIG. 1B. FIG. 1E illustrates a third electrode pattern in FIG. 1D according to an embodiment of the present disclosure.

Referring to FIGS. 1A to 1D, the semiconductor device may include first conductive lines 110, memory cells 120, and second conductive lines 180. The semiconductor device may further include one or more of first liner patterns 130, second liner patterns 140, third liner patterns 150, first gap-fill patterns 170, second gap-fill patterns 190, and capping patterns CL.

The memory cells 120 may be arranged in a first direction I and a second direction II intersecting the first direction I. The memory cell 120 may be disposed between the first conductive line 110 and the second conductive line 180 in a third direction III that is perpendicular to the first and the second directions I and II. The memory cell 120 may include a variable resistance pattern 127. The memory cell 120 may further include one or more of a first electrode pattern 121, a switching pattern 123, a second electrode pattern 125, and a third electrode pattern 129.

The switching pattern 123 may be disposed on the first electrode pattern 121. The second electrode pattern 125 may be disposed on the switching pattern 123. The first electrode pattern 121, the switching pattern 123, and the second electrode pattern 125 may constitute a selection element. The selection element may be implemented with a diode, a PNP diode, a transistor, a vertical transistor, a bipolar junction transistor (BJT), a metal insulator transition (MIT) element, a mixed ionic-electronic conduction (MIEC) element, or an ovonic threshold switching (OTS) element. For example, the switching pattern 123 may include a chalcogenide material. The first electrode pattern 121 may be a lower electrode. The second electrode pattern 125 may be an intermediate electrode. The first electrode pattern 121 or the second electrode pattern 125 may include a metal, a metal nitride, carbon, or a carbon nitride.

The switching pattern 123 may have a fifth width w5 in the first direction I and a sixth width w6 in the second direction II. The fifth width w5 and the sixth width w6 may be different from each other. For example, the sixth width w6 may be smaller than the fifth width w5. The sixth width w6 may be 50% to 90% of a twelfth width w12 of the second electrode pattern 125 in the second direction II or 50% to 90% of a thirteenth width w13 of the first electrode pattern 121 in the second direction II. The reason for this is that if the sixth width w6 is less than 50% of the twelfth width w12 or the thirteenth width w13, it is apprehended that the memory cell 120 may slant or collapse. The fifth width w5 may be substantially the same as the twelfth width w12 or the thirteenth width w13. Furthermore, since the switching pattern 123 has the sixth width w6 smaller than the fifth width w5 in the second direction II, a space for forming the third liner patterns 150 that face the switching pattern 123 in the second direction II can be secured.

The variable resistance pattern 127 may be disposed between the first conductive line 110 and the second conductive line 180. For example, the variable resistance pattern 127 may be disposed on the second electrode pattern 125. The third electrode pattern 129 may be disposed on the variable resistance pattern 127. The second electrode pattern 125, the variable resistance pattern 127, and the third electrode pattern 129 may constitute a memory element. The memory element and the selection element may share the second electrode pattern 125. The variable resistance pattern 127 may include a chalcogenide material.

The variable resistance pattern 127 may have a first width w1 in the first direction I and a second width w2 in the second direction II. The first width w1 and the second width w2 may be different from each other. For example, the second width w2 may be smaller than the first width w1. The second width w2 may be 50% to 90% of a fourth width w4 of the third electrode pattern 129 in the second direction II or may be 50% to 90% of the twelfth width w12 of the second electrode pattern 125 in the second direction II. The reason for this is that if the second width w2 is less than 50% of the fourth width w4 or the twelfth width w12, it is apprehended that the memory cell 120 may slant or collapse. The first width w1 may be substantially the same as the fourth width w4 or the twelfth width w12. Since the variable resistance pattern 127 has the second width w2 smaller than the first width w1 in the second direction II, a space for forming the first liner patterns 130 that face the variable resistance pattern 127 in the second direction II can be secured.

The third electrode pattern 129 may be disposed between the variable resistance pattern 127 and the second conductive line 180. The third electrode pattern 129 may be an upper electrode. The third electrode pattern 129 may include a metal, a metal nitride, carbon, or a carbon nitride.

The third electrode pattern 129 may have a third width w3 in the first direction I and the fourth width w4 in the second direction II. The third width w3 and the fourth width w4 may be different from each other. For example, the third width w3 may be smaller than the fourth width w4. The third width w3 may be 50% to 90% of a fourteenth width w14 of the second conductive line 180 in the first direction I. The reason for this is that if the third width w3 is less than 50% of the fourteenth width w14, it is apprehended that the memory cell 120 may slant or collapse. The fourth width w4 may be substantially the same as the fourteenth width w14. Since the third electrode pattern 129 has the third width w3 smaller than the fourth width w4 in the first direction I, a space for forming the second liner patterns 140 that face the third electrode pattern 129 in the first direction I can be secured.

Furthermore, a first distance d1 can be secured between the third electrode patterns 129 that are adjacent to each other in the first direction I. The first distance d1 may be different from a second distance d2 between the second electrode patterns 125 that are adjacent to each other in the first direction I. For example, the first distance d1 may be greater than the second distance d2. Accordingly, before a subsequent process of forming the memory cells 120, a distance margin between the third electrode patterns 129 that are adjacent to each other in the first direction I can be secured.

The third electrode pattern 129 can reduce a reset current of the memory element. For example, since the third width w3 of the third electrode pattern 129 in the first direction I is smaller than the fourth width w4 of the third electrode pattern 129 in the second direction II, resistance of the third electrode pattern 129 may be greater and an amount of heat generated in the third electrode pattern 129 may be greater, compared to a case in which the third width w3 is substantially the same as the fourth width w4. Accordingly, when a reset operation is performed in the memory cell 120, the reset current can be decreased.

The first conductive lines 110 may extend in the first direction I. The first conductive lines 110 may be spaced apart from each other and arranged in the second direction II. The first conductive line 110 may be disposed below the memory cell 120, and may be electrically connected to the first electrode pattern 121. The first conductive line 110 may be a word line or a bit line. The first conductive line 110 may include a conductive material, such as tungsten.

The first conductive line 110 may have a high level HL, a low level LL, and a middle level ML between the high level HL and the low level LL in the third direction III. The first conductive line 110 may have different widths according to the levels. For example, the first conductive line 110 may have a seventh width w7 at the high level HL, an eighth width w8 at the middle level ML, and a ninth width w9 at the low level LL, in the second direction II. The eighth width w8 may be smaller than the seventh width w7. For example, the eighth width w8 may be a minimum width of the first conductive line 110. The ninth width w9 may be greater than the seventh width w7. For example, the ninth width w9 may be a maximum width of the first conductive line 110.

The eighth width w8 may be 80% to 100% of the seventh width w7. The reason for this is that if the eighth width w8 is less than 80% of the seventh width w7, it is apprehended that the memory cell 120 may slant or collapse. Since the eighth width w8 is smaller than the seventh width w7, a fourth distance d4 can be secured at the middle level ML between the first conductive lines 110 that are adjacent to each other in the second direction II. The fourth distance d4 at the middle level ML may be different from a third distance d3 at the high level HL between the first conductive lines 110 that are adjacent to each other in the second direction II. For example, the fourth distance d4 may be greater than the third distance d3. Accordingly, the first conductive lines 110 can be electrically easily separated from each other because the fourth distance d4 is secured between the first conductive lines 110 at the middle level ML.

The ninth width w9 at the low level LL may be 100% to 120% of the seventh width w7. The reason for this is that if the ninth width w9 is greater than 120% of the seventh width w7, a bridge may be generated between first conductive lines 110 adjacent to each other in the second direction II, so that a distance margin between the memory cells 120 that are adjacent to each other in the second direction II is not secured. Since the ninth width w9 is greater than the seventh width w7, the slanting of the first conductive line 110 can be prevented or minimized.

The second conductive lines 180 may extend in the second direction II. The second conductive lines 180 may be spaced apart from each other and arranged in the first direction I. The second conductive line 180 may be disposed on the memory cell 120, and may be electrically connected to the third electrode pattern 129. The second conductive line 180 may be a word line or a bit line. For example, the first conductive line 110 may be a word line, and the second conductive line 180 may be a bit line. As another example, the first conductive line 110 may be a bit line, and the second conductive line 180 may be a word line. The second conductive line 180 may include a conductive material, such as tungsten.

The first liner patterns 130 may extend in the first direction I and cover sidewalls of the variable resistance pattern 127. For example, the first liner patterns 130 may be disposed on the sidewalls of the variable resistance pattern 127 that face the first liner patterns 130 in the second direction II. A total width in the second direction II of the first liner patterns 130 disposed on the sidewalls of the variable resistance pattern 127 may correspond to a difference between the fourth width w4 and the second width w2, i.e., w4−w2. The first liner patterns 130 might not be removed in a subsequent manufacturing process of the semiconductor device, and may remain on the sidewalls of the variable resistance pattern 127, so that they can protect the variable resistance pattern 127 in the subsequent manufacturing process. The first liner patterns 130 may include an insulating material, such as a nitride or an oxide. For example, the first liner patterns 130 may include a silicon nitride.

The first gap-fill patterns 170 may each be disposed between two memory cells 120 that are adjacent to each other in the second direction II. The first gap-fill patterns 170 may fill spaces between the memory cells 120 that are adjacent to each other in the second direction II. The first gap-fill patterns 170 may include an insulating material, such as an oxide or a nitride.

The second liner patterns 140 may extend in the second direction II and cover sidewalls of the third electrode pattern 129. For example, the second liner patterns 140 may be disposed on the sidewalls of the third electrode pattern 129 that face the second liner patterns 140 in the first direction I. A total width in the first direction I of the second liner patterns 140 disposed on the sidewalls of the third electrode pattern 129 may correspond to a difference between the third width w3 and the first width w1, i.e., w1−w3. The second liner patterns 140 might not be removed in a subsequent manufacturing process of the semiconductor device, and may remain on the sidewalls of the third electrode pattern 129, so that they can protect the third electrode pattern 129 in the subsequent manufacturing process. The second liner patterns 140 may include an insulating material, such as a nitride or an oxide. For example, the second liner patterns 140 may include a silicon nitride.

The second gap-fill patterns 190 may each be disposed between two memory cells 120 that are adjacent to each other in the first direction I. The second gap-fill patterns 190 may fill spaces between the memory cells 120 that are adjacent to each other in the first direction I. The second gap-fill patterns 190 may include an insulating material, such as an oxide or a nitride.

The third liner patterns 150 may extend in the first direction I and cover sidewalls of the switching pattern 123. For example, the third liner patterns 150 may be disposed on the sidewalls of the switching pattern 123 that face the third liner patterns 150 in the second direction II. A total width in the second direction II of the third liner patterns 150 disposed on the sidewalls of the switching pattern 123 may correspond to a difference between the twelfth width w12 and the sixth width w6, i.e., w12−w6. The third liner patterns 150 might not be removed in a subsequent manufacturing process of the semiconductor device, and may remain on the sidewalls of the switching pattern 123, so that they can protect the switching pattern 123 in the subsequent manufacturing process. The third liner patterns 150 may include an insulating material, such as a nitride or an oxide. For example, the third liner patterns 150 may include a silicon nitride.

The capping patterns CL may extend in the first direction I and cover sidewalls of the first conductive line 110. The capping patterns CL may extend in the second direction II and cover sidewalls of the third electrode patterns 129. The capping patterns CL may extend in the third direction III and cover sidewalls of the memory cells 120, the first conductive line 110, or the second conductive line 180. For example, the capping patterns CL may each be disposed between the first liner pattern 130 and the first gap-fill pattern 170 and may extend in the first direction I and the third direction III, or may each be disposed between the second liner pattern 140 and the second gap-fill pattern 190 and may extend in the second direction II and the third direction III, or may each be disposed between the third liner pattern 150 and the first gap-fill pattern 170 and may extend in the first direction I and the third direction III. The capping patterns CL may include an insulating material, such as a nitride. For example, the capping patterns CL may include a silicon nitride.

Among the capping patterns CL, the capping patterns CL extending in the first direction I and the third direction III may each be disposed on sidewalls of the first conductive line 110 that face the capping patterns CL in the second direction II. In this case, the capping patterns CL disposed on the sidewalls of the first conductive line 110 that face the capping patterns CL in the second direction II may be referred to as fourth liner patterns 160 that are shown in FIG. 1C. Accordingly, the fourth liner patterns 160 may be disposed on the sidewalls of the first conductive line 110 that face the fourth liner patterns 160 in the second direction II. The fourth liner patterns 160 may each have different widths in the second direction II according to the high, middle, and low levels HL, ML, and LL. For example, each of the fourth liner patterns 160 may have a maximum width at the middle level ML, and may have a minimum width at the low level LL. The fourth liner patterns 160 might not be removed in a subsequent manufacturing process of the semiconductor device, and may remain on the sidewalls of the first conductive line 110, so that they can protect the first conductive line 110 in the subsequent manufacturing process. The fourth liner patterns 160 may include an insulating material, such as a nitride or an oxide. For example, the fourth liner patterns 160 may include a silicon nitride.

Referring to FIG. 1E, the third electrode pattern 129 may include a first part 129_1 and a second part 129_2 that is disposed below the first part 129_1 in the third direction III. The first part 129_1 may have the third width w3 in the first direction I and the fourth width w4 in the second direction II. The second part 129_2 may have a tenth width w10 in the first direction I and an eleventh width (not illustrated) in the second direction II. The tenth width w10 may be substantially the same as the eleventh width (not illustrated). The second liner patterns 140 may be disposed on sidewalls of the first part 129_1 of the third electrode pattern 129 that face the second liner patterns 140 in the first direction I. The first part 129_1 and the second part 129_2 may include a metal, a metal nitride, carbon, or a carbon nitride. In an embodiment, the first part 129_1 and the second part 129_2 may include different materials. For example, the first part 129_1 may include tungsten silicon nitride (WSIN), and the second part 129_2 may include carbon.

According to the aforementioned structure, the liner patterns 130, 150, and 160 may be disposed on the sidewalls of the variable resistance pattern 127, the switching pattern 123, and the first conductive line 110 that face the liner patterns 130, 150, and 160 in the second direction II. Furthermore, the liner patterns 140 may be disposed on the sidewalls of the third electrode pattern 129 that face the liner patterns 140 in the first direction I. Accordingly, the memory cells 120 and the first conductive line 110 can be protected by the liner patterns 130, 140, 150, and 160.

Figure 2A:
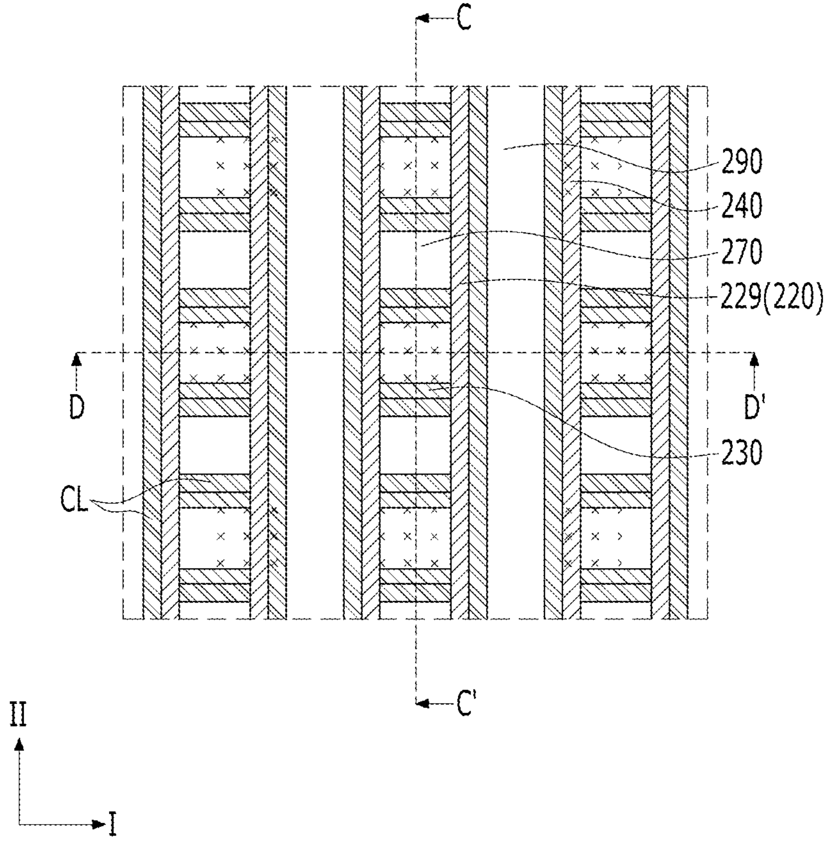
FIGS. 2A to 2C illustrate a semiconductor device according to another embodiment of the present disclosure.
Figure 2B:
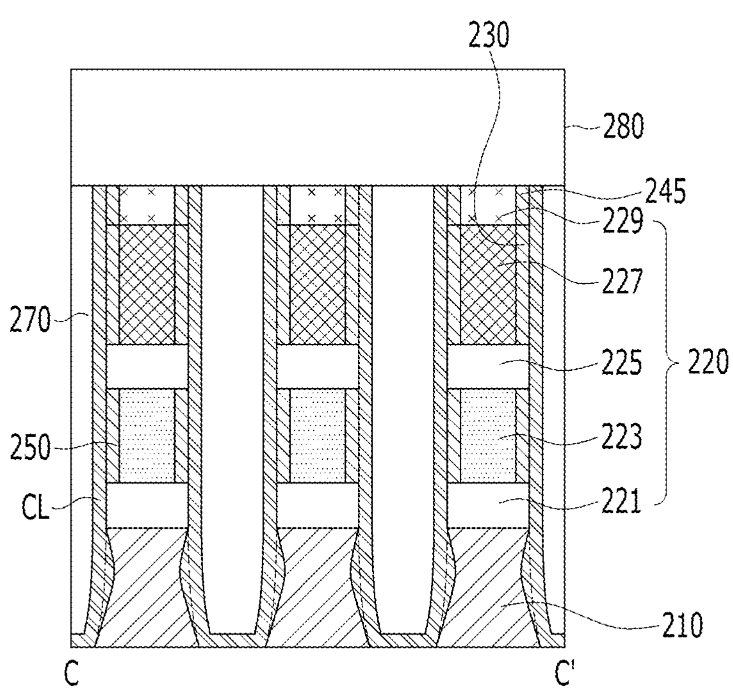
Figure 2B:
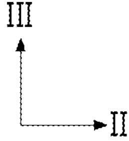
Figure 2C:
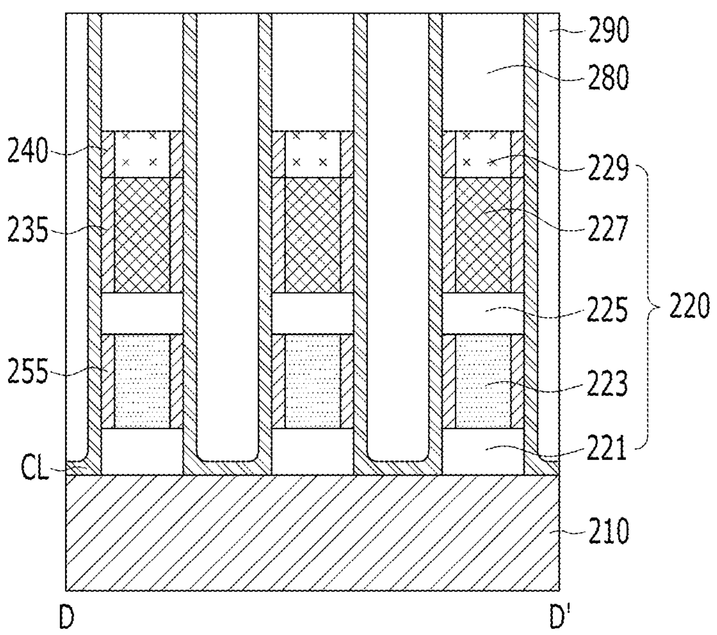
Figure 2C:
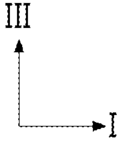

FIGS. 2A to 2C illustrate a semiconductor device according to another embodiment of the present disclosure. FIG. 2A is a plan view of the semiconductor device. FIG. 2B is a cross-sectional view taken along line C-C' in FIG. 2A. FIG. 2C is a cross-sectional view taken along line D-D' in FIG. 2A. Herein, contents that are redundant with the aforementioned contents are omitted.

Referring to FIGS. 2A to 2C, the semiconductor device may include first conductive lines 210, memory cells 220, and second conductive lines 280. The semiconductor device may further include one or more of second liner patterns 240, fifth liner patterns 245, first liner patterns 230, sixth liner patterns 235, third liner patterns 250, seventh liner patterns 255, first gap-fill patterns 270, second gap-fill patterns 290, and capping patterns CL.

The memory cells 220 may each include a variable resistance pattern 227. The memory cell 220 may further include one or more of a first electrode pattern 221, a switching pattern 223, a second electrode pattern 225, and a third electrode pattern 229.

The second liner patterns 240 and the fifth liner patterns 245 may surround four sidewalls of the third electrode pattern 229. For example, the second liner patterns 240 may extend in a second direction II and cover two of the four sidewalls of the third electrode pattern 229 that face in a first direction I. The fifth liner patterns 245 may extend in the first direction I and cover two of the four sidewalls of the third electrode pattern 229 that face in the second direction II. In other words, the second liner patterns 240 may be disposed on the two sidewalls of the third electrode pattern 229 that face the second liner patterns 240 in the first direction I. The fifth liner patterns 245 may be disposed on the two sidewalls of the third electrode pattern 229 that face the fifth liner patterns 245 in the second direction II.

The second liner patterns 240 and the fifth liner patterns 245 might not be removed in a subsequent manufacturing process of the semiconductor device, and may remain on the sidewalls of the third electrode pattern 229, so that they can protect the third electrode pattern 229 in the subsequent manufacturing process. The second liner patterns 240 and the fifth liner patterns 245 may each include an insulating material, such as a nitride or an oxide. For example, the second liner patterns 240 and the fifth liner patterns 245 may each include a silicon nitride.

The first liner patterns 230 and the sixth liner patterns 235 may surround four sidewalls of the variable resistance pattern 227. For example, the first liner patterns 230 may extend in the first direction I and cover two of the four sidewalls of the variable resistance pattern 227 that face in the second direction II. The sixth liner patterns 235 may extend in the second direction II and cover two of the four sidewalls of the variable resistance pattern 227 that face in the first direction I. In other words, the first liner patterns 230 may be disposed on the two sidewalls of the variable resistance pattern 227 that face the first liner patterns 230 in the second direction II. The sixth liner patterns 235 may be disposed on the two sidewalls of the variable resistance pattern 227 that face the sixth liner patterns 235 in the first direction I.

The first liner patterns 230 and the sixth liner patterns 235 might not be removed in a subsequent manufacturing process of the semiconductor device, and may remain on the sidewalls of the variable resistance pattern 227, so that they can protect the variable resistance pattern 227 in the subsequent manufacturing process. The first liner patterns 230 and the sixth liner patterns 235 may each include an insulating material, such as a nitride or an oxide. For example, the first liner patterns 230 and the sixth liner patterns 235 may each include a silicon nitride.

The third liner patterns 250 and the seventh liner patterns 255 may surround four sidewalls of the switching pattern 223. For example, the third liner patterns 250 may extend in the first direction I and cover two of the four sidewalls of the switching pattern 223 that face in the second direction II. The seventh liner patterns 255 may extend in the second direction II and cover two of the four sidewalls of the switching pattern 223 that face in the first direction I. In other words, the third liner patterns 250 may be disposed on the two sidewalls of the switching pattern 223 that face the third liner patterns 250 in the second direction II. The seventh liner patterns 255 may be disposed on the two sidewalls of the switching pattern 223 that face the seventh liner patterns 255 in the first direction I.

The third liner patterns 250 and the seventh liner patterns 255 might not be removed in a subsequent manufacturing process, and may remain on the sidewalls of the switching pattern 223, so that they can protect the switching pattern 223 in the subsequent manufacturing process. The third liner patterns 250 and the seventh liner patterns 255 may each include an insulating material, such as a nitride or an oxide. For example, the third liner patterns 250 and the seventh liner patterns 255 may each include a silicon nitride.

According to the aforementioned structure, the liner patterns 240 and 245 may be disposed on the sidewalls of the third electrode pattern 229 in the first direction I and the second direction II. The liner patterns 230, 235, 250, and 255 may be disposed on the sidewalls of the variable resistance pattern 227 and the switching pattern 223. Accordingly, the third electrode pattern 229, the variable resistance pattern 227, and the switching pattern 223 can be protected in a manufacturing process of the semiconductor device.

FIGS. 3A and 3B, 4A and 4B, 5A and 5B, 6A and 6B, 7A and 7B, 8A and 8B, 9A and 9B, 10A and 10B, 11A and 11B, 12A and 12B, and 13A and 13B illustrate a method of manufacturing a semiconductor device according to an embodiment of the present disclosure. FIGS. 3A, 4A, 5A, 6A, 7A, 8A, 9A, 10A, 11A, 12A, and 13A are plan views of the semiconductor device. FIGS. 3B, 4B, 5B, 6B, 7B, 8B, and 9B are cross-sectional views taken along line A-A' in FIGS. 3A, 4A, 5A, 6A, 7A, 8A, and 9A, respectively. FIGS. 10B, 11B, 12B, and 13B are cross-sectional views taken along line B-B' in FIGS. 10A, 11A, 12A, and 13A, respectively. Herein, contents that are redundant with the aforementioned contents are omitted.

Figure 3A:
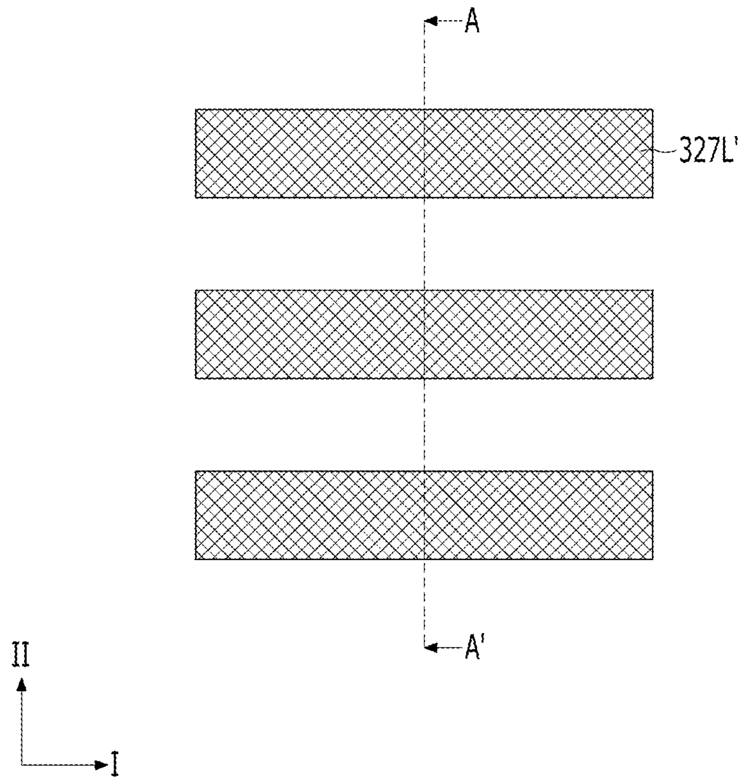
FIGS. 3A and 3B, 4A and 4B, 5A and 5B, 6A and 6B, 7A and 7B, 8A and 8B, 9A and 9B, 10A and 10B, 11A and 11B, 12A and 12B, and 13A and 13B illustrate a method of manufacturing a semiconductor device according to an embodiment of the present disclosure.
Figure 3B:
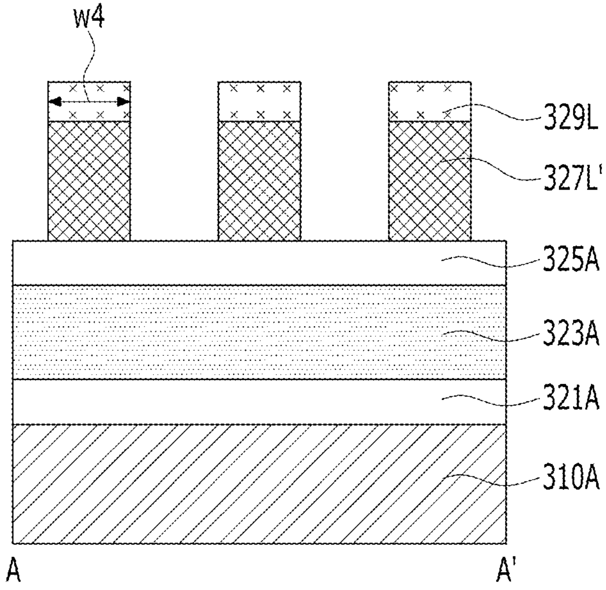
Figure 3B:
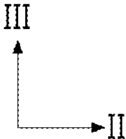

Referring to FIGS. 3A and 3B, third electrode lines 329L and preliminary variable resistance lines 327L' that extend in a first direction I may be formed. Each of the third electrode lines 329L and the preliminary variable resistance lines 327L' may be spaced apart from each other in a second direction II that intersects the first direction I.

Before forming the third electrode lines 329L and the preliminary variable resistance lines 327L', a first conductive layer 310A may be formed over a substrate (not illustrated). Next, a memory stack including a variable resistance layer may be formed over the first conductive layer 310A. For example, the variable resistance layer may be formed over the first conductive layer 310A. The memory stack may be formed by sequentially stacking a first electrode layer 321A, a switching layer 323A, a second electrode layer 325A, the variable resistance layer, and a third electrode layer in a third direction III that intersects the first direction I and the second direction II. In this case, the third direction III may be orthogonal to a plane that is defined by the first direction I and the second direction II.

Next, the third electrode line 329L that extends in the first direction I may be formed by etching the third electrode layer of the memory stack. In this case, the third electrode line 329L may have a fourth width w4 in the second direction II. The third electrode lines 329L may include a metal, a metal nitride, carbon, or a carbon nitride.

Next, the preliminary variable resistance line 327L' that extends in the first direction I may be formed by etching the variable resistance layer of the memory stack. For example, the variable resistance layer may be etched in a vertical direction corresponding to the third direction III. In such a case, in a cross section defined in the second direction II and the third direction III, the preliminary variable resistance line 327L' and the third electrode line 329L may have substantially the same width, i.e., the fourth width w4. The preliminary variable resistance lines 327L' may include a chalcogenide material.

Figure 4A:
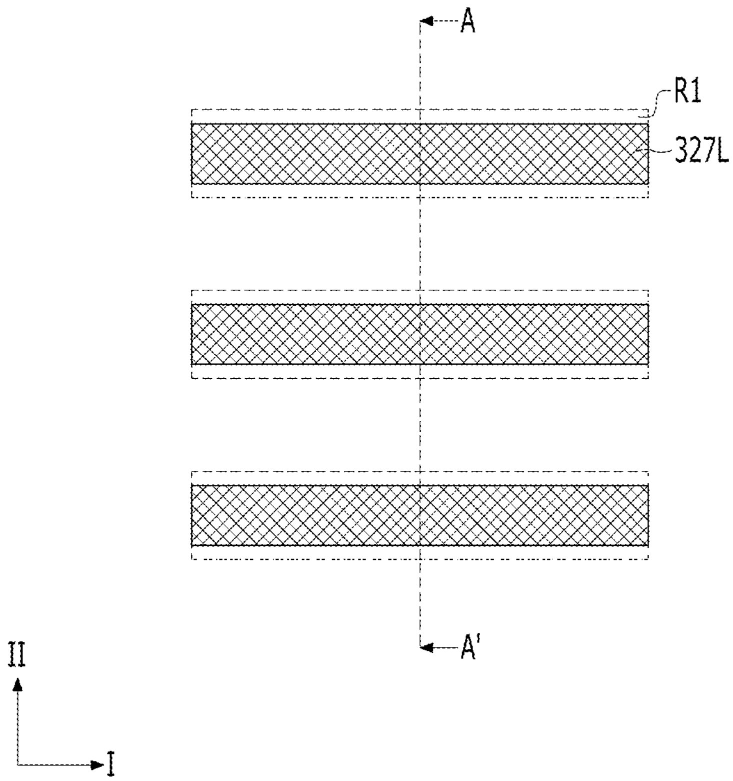
Figure 4B:
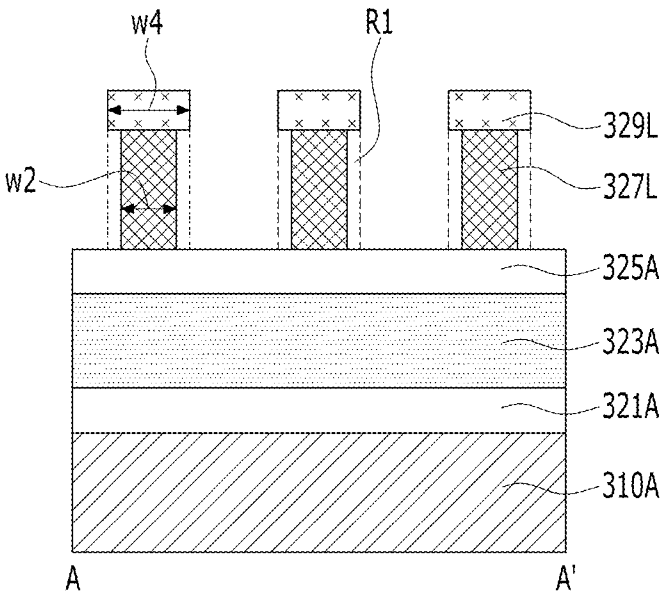

Referring to FIGS. 4A and 4B, variable resistance lines 327L may be formed. For example, after forming the preliminary variable resistance lines 327L', the variable resistance layer may be further etched in a horizontal direction by first recesses R1. In such a case, in a cross section defined in the second direction II and the third direction III, the variable resistance line 327L may have a narrower width than the third electrode line 329L, and the first recesses R1 may be formed under both edges of the third electrode line 329L in the second direction II. For example, at least one of a flow rate of an etch gas, pressure, and an etch time may be increased compared to the step of etching the variable resistance layer in the vertical direction. In this case, the "pressure" may mean pressure inside a chamber for manufacturing the semiconductor device. For example, forming the preliminary variable resistance lines 327L' and etching the variable resistance layer may be performed inside a chamber. Accordingly, the first recesses R1 may be formed by increasing an etch rate in the horizontal direction. Accordingly, the variable resistance lines 327L and the first recesses R1 that extend in the first direction I may be formed.

For reference, the variable resistance layer may be etched in the vertical direction and may also be etched in the horizontal direction to form the variable resistance lines 327L and the first recesses R1. At this time, an etch rate in the vertical direction and an etch rate in the horizontal direction may be adjusted using one or more of the flow rate of the etch gas, the pressure, and the etch time. For example, the etch rate in the horizontal direction may be increased by increasing at least one of the flow rate of the etch gas, the pressure, and the etch time. Accordingly, the first recesses R1 may be formed.

As the first recesses R1 are formed by horizontally etching the preliminary variable resistance lines 327L', the variable resistance lines 327L may each have a second width w2. The first recesses R1 formed on both sidewalls of the variable resistance line 327L in the second direction II may have a width corresponding to a difference between the fourth width w4 of the third electrode lines 329L and the second width w2 of the variable resistance lines 327L, i.e., w4−w2. Therefore, each of the first recesses R1 formed on the both sidewalls of the variable resistance line 327L may have a width corresponding to a half of the difference between the fourth width w4 and the second width w2, i.e., ½(w4−w2). The second width w2 may be 50% to 90% of the fourth width w4. The reason for this is that when the second width w2 is less than 50% of the fourth width w4, it is apprehended that the memory stack may slant or collapse.

Figure 5A:
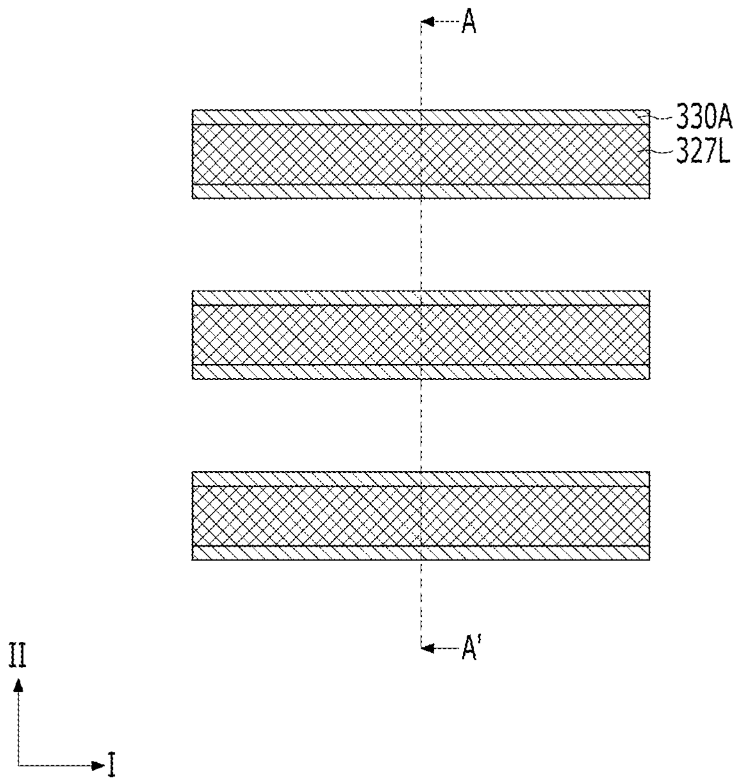
Figure 5B:
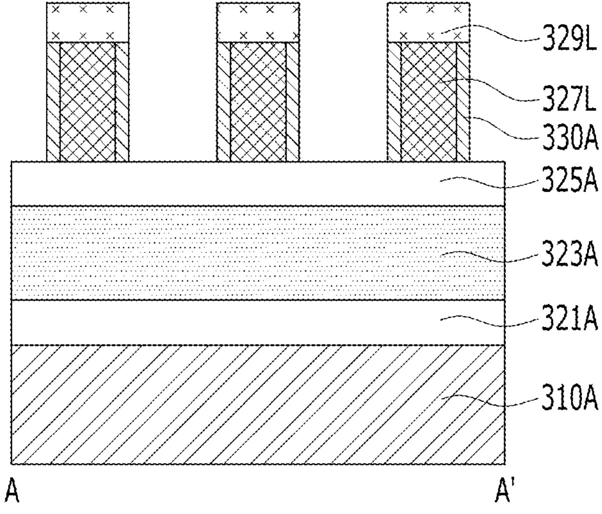
Figure 5B:
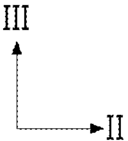

Referring to FIGS. 5A and 5B, first liner layers 330A may be formed within the first recesses R1, respectively. First, preliminary first liner layers may be formed on the first recesses R1, respectively, in the second direction II. The preliminary first liner layers may be conformally formed along profiles of the third electrode lines 329L and the variable resistance lines 327L. Next, the first liner layers 330A may be formed within the first recesses R1 by etching the preliminary first liner layers. The first liner layers 330A may each have a width corresponding to the half of the difference between the fourth width w4 and the second width w2, i.e., ½(w4−w2). The first liner layers 330A may include an insulating material, such as a nitride or an oxide. For example, the first liner layers 330A may include a silicon nitride.

In another embodiment, before the first liner layers 330A are formed, fifth liner layers may be formed on sidewalls of each third electrode line in the second direction II. First, the third electrode layer may be etched in the vertical direction and may also be etched in the horizontal direction to form the third electrode line with fifth recesses. Accordingly, the fifth recesses may be formed by etching the third electrode layer in the horizontal direction. Next, the fifth liner layers may be formed within the fifth recesses. As a result, the sidewalls of the third electrode line that face in the second direction II may be covered by the fifth liner layers. This structure including the third electrode line covered by the fifth liner layers may be similar to the third electrode pattern 229 covered by the fifth liner pattern 245 illustrated in FIG. 2B.

Figure 6A:
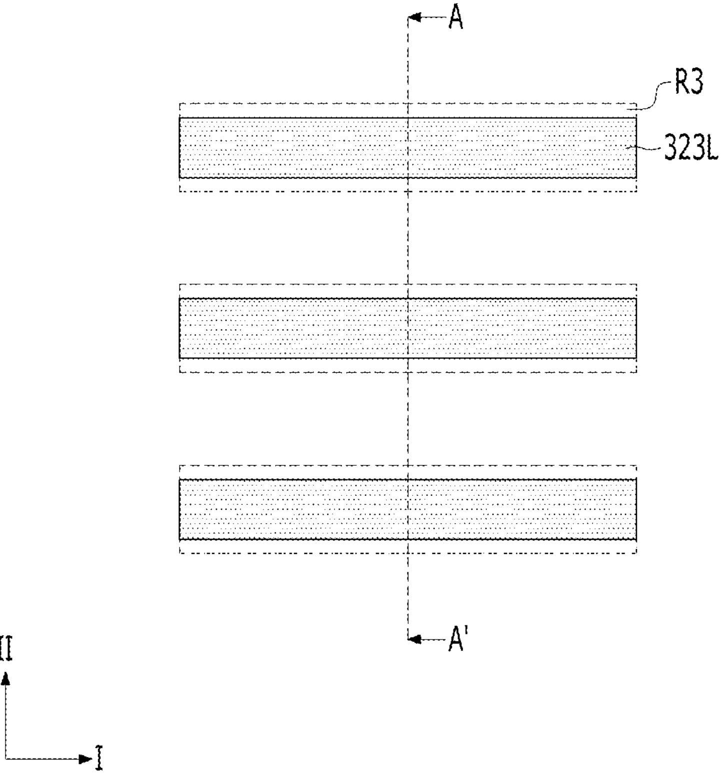
Figure 6B:
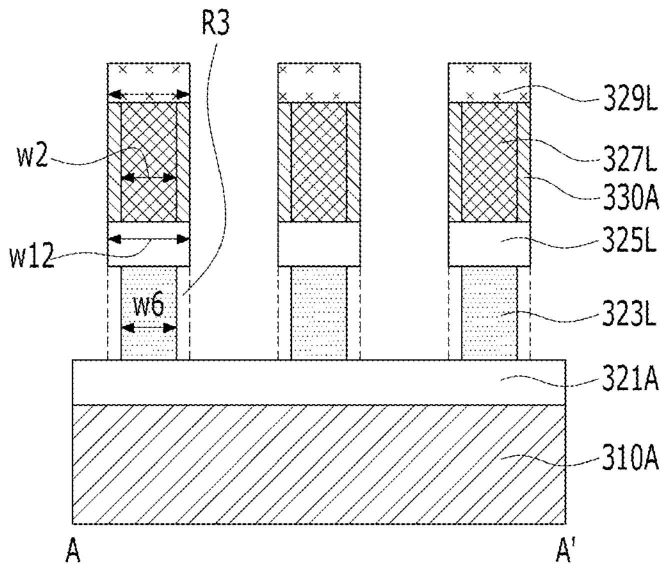
Figure 6B:
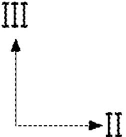

Referring to FIGS. 6A and 6B, second electrode lines 325L that extend in the first direction I may be formed by etching the second electrode layer 325A of the memory stack. In this case, the second electrode lines 325L may each have a twelfth width w12 in the second direction II. The second electrode lines 325L may include a metal, a metal nitride, carbon, or a carbon nitride.

Next, switching lines 323L that extend in the first direction I may be formed by etching the switching layer 323A of the memory stack. For example, the switching layer 323A may be etched in the vertical direction and may also be etched in the horizontal direction to form switching lines 323L.

Third recesses R3 may be formed by etching the switching layer 323A in the horizontal direction. In such a case, in a cross section defined in the second direction II and the third direction III, the switching line 323L may have a narrower width than the second electrode line 325L. For example, at least one of a flow rate of an etch gas, pressure, and an etch time may be increased compared to the step of etching the switching layer 323A in the vertical direction. Accordingly, the third recesses R3 may be formed by increasing an etch rate in the horizontal direction. Accordingly, the switching lines 323L and the third recesses R3, which extend in the first direction I, may be formed.

For reference, the switching layer 323A may be etched in the vertical direction and may also be etched in the horizontal direction. At this time, an etch rate in the vertical direction and the etch rate in the horizontal direction may be adjusted based on the flow rate of the etch gas, the pressure, and the etch time. For example, the etch rate in the horizontal direction may be increased by increasing at least one of the flow rate of the etch gas, the pressure, and the etch time. Accordingly, the third recesses R3 may be formed.

As the third recesses R3 are formed on both sidewalls of the switching line 323L in the second direction II, the switching line 323L may have a sixth width w6 that is smaller than the twelfth width w12 of the second electrode line 325L. The third recesses R3 formed on the both sidewalls of the switching line 323L may have a width corresponding to a difference between the twelfth width w12 of the second electrode line 325L and the sixth width w6, i.e., w12−w6. Therefore, each of the third recesses R3 formed on the both sidewalls of the switching line 323L may have a width corresponding to a half of the difference between the twelfth width w12 and the sixth width w6, i.e., ½(w12−w6). The sixth width w6 may be 50% to 90% of the twelfth width w12. The reason for this is that when the sixth width w6 is less than 50% of the twelfth width w12, it is apprehended that the memory stack may slant or collapse.

Figure 7A:
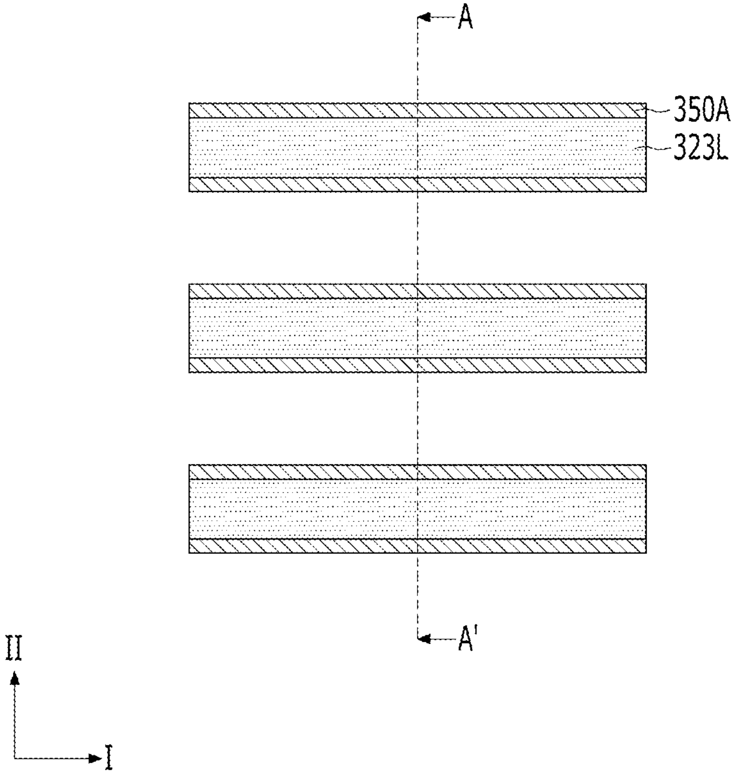
Figure 7B:
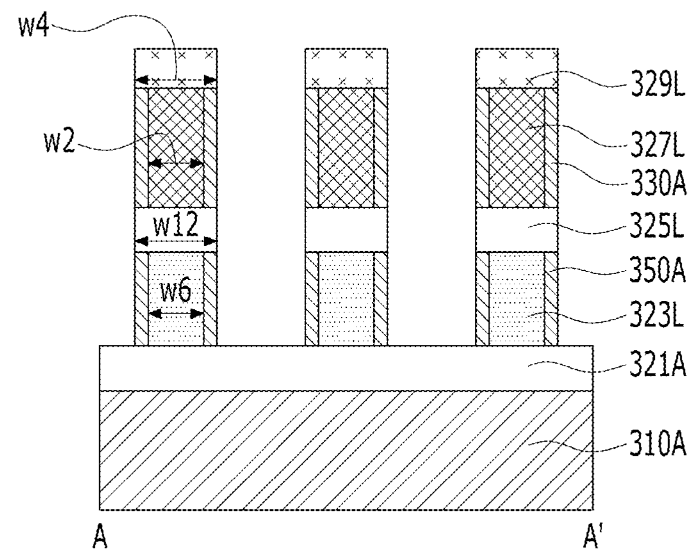
Figure 7B:
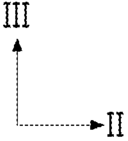

Referring to FIGS. 7A and 7B, third liner layers 350A may be formed within the third recesses R3, respectively. First, preliminary third liner layers may be formed to fill the third recesses R3, respectively. The preliminary third liner layers may be conformally formed along profiles of the third electrode lines 329L, the variable resistance lines 327L, the second electrode lines 325L, and the switching lines 323L. Next, the third liner layers 350A may be formed within the third recesses R3 by etching the preliminary third liner layers. The third liner layers 350A formed within the third recesses R3 may each have a width corresponding to a half of a difference between the twelfth width w12 and the sixth width w6, i.e., ½(w12−w6). The third liner layers 350A may include an insulating material, such as a nitride or an oxide. For example, the third liner layers 350A may include a silicon nitride.

Figure 8A:
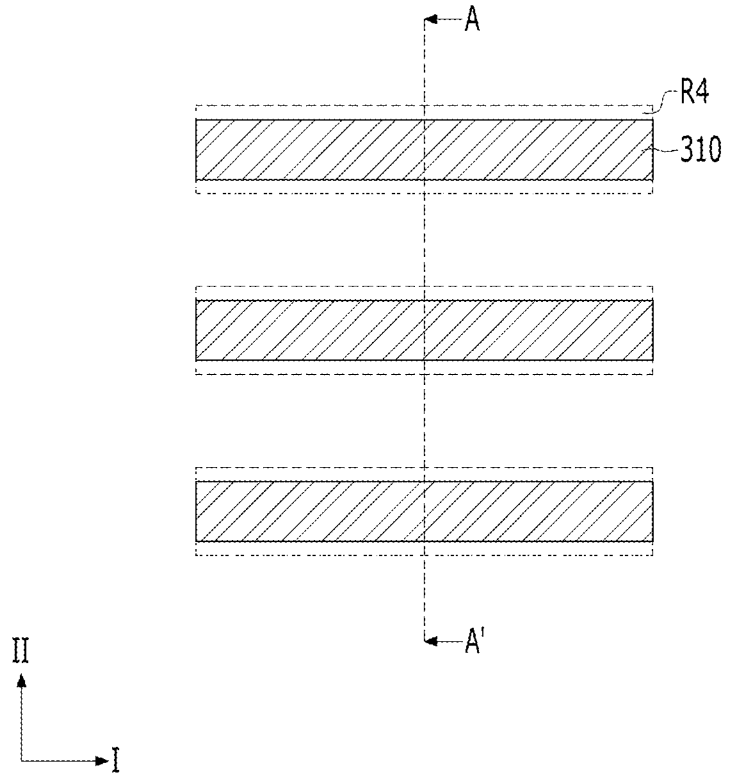
Figure 8B:
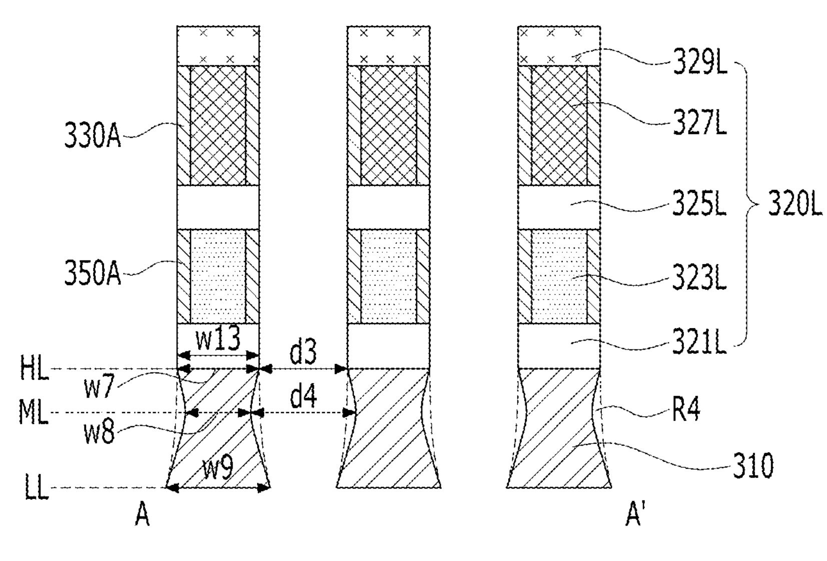

Referring to FIGS. 8A and 8B, first electrode lines 321L that extend in the first direction I may be formed by etching the first electrode layer 321A of the memory stack. For example, the first electrode layer 321A may be etched in the vertical direction. Accordingly, a memory line 320L including the first electrode line 321L, the switching line 323L, the second electrode line 325L, the variable resistance line 327L, and the third electrode line 329L may be defined. The first electrode lines 321L may include a metal, a metal nitride, carbon, or a carbon nitride.

Next, first conductive lines 310 that extend in the first direction I may be formed by etching the first conductive layer 310A. For example, the first conductive layer 310A may be etched in the vertical direction. Next, fourth recesses R4 may be formed. For example, the first conductive layer 310A may be further etched in the horizontal direction after being etched in the vertical direction. In such a case, the first conductive line 310 may have a narrower width than the first electrode line 321L, and the fourth recesses R4 may be formed at both sides of the first conductive line 310 in the second direction II. For example, when etching the first conductive layer 310A in the horizontal direction, at least one of a flow rate of an etch gas, pressure, and an etch time may be increased compared to the step of etching the first conductive layer 310A in the vertical direction. Accordingly, the fourth recesses R4 may be formed by increasing an etch rate in the horizontal direction.

Furthermore, the fourth recesses R4 may be formed by etching the first conductive layer 310A in the horizontal direction with a reduced flow rate of a passivation gas compared to the step of etching the first conductive layer 310A in the vertical direction. In this case, the passivation gas may be $SiCl_4$. Accordingly, the fourth recesses R4 may be formed to be disposed on sidewalls of the first conductive lines 310, extend in the first direction I, and face the first conductive lines 310 in the second direction II. In this case, the first conductive line 310 may be a word line or a bit line. The first conductive line 310 may include a conductive material, such as tungsten.

The first conductive lines 310 may each have a high level HL, a low level LL, and a middle level ML between the high level HL and the low level LL in the third direction III. The first conductive lines 310 may each have different widths according to the levels HL, ML, and LL. For example, the first conductive line 310 may have a seventh width w7 at the high level HL, an eighth width w8 at the middle level ML, and a ninth width w9 at the low level LL, in the second direction II. The eighth width w8 may be smaller than the seventh width w7. For example, the eighth width w8 may be a minimum width of the first conductive line 310. The ninth width w9 may be greater than the seventh width w7. For example, the ninth width w9 may be a maximum width of the first conductive line 310.

The eighth width w8 may be 80% to 100% of the seventh width w7. The reason for this is that if the eighth width w8 is less than 80% of the seventh width w7, it is apprehended that the memory line 320L may slant or collapse. Since the eighth width w8 is smaller than the seventh width w7, a fourth distance d4 can be secured at the middle level ML between the first conductive lines 310 that are adjacent to each other in the second direction II. The fourth distance d4 may be different from a third distance d3 at the high level HL between the first conductive lines 310 that are adjacent to each other in the second direction II. For example, the fourth distance d4 may be greater than the third distance d3. Accordingly, the first conductive lines 310 can be easily electrically separated from each other because the fourth distance d4 is secured at the middle level ML between the first conductive lines 310.

The ninth width w9 may be 100% to 120% of the seventh width w7. The reason for this is that if the ninth width w9 is greater than 120% of the seventh width w7, a bridge may be generated between first conductive lines 310 adjacent to each other in the second direction II, so that a distance margin between the first conductive lines 310 that are adjacent to each other in the second direction II is not secured. Since the ninth width w9 is greater than the seventh width w7, the slanting of the first conductive line 310 can be prevented or minimized.

For reference, the first conductive layer 310A may be etched in the vertical direction and may also be etched in the horizontal direction. At this time, an etch rate in the vertical direction and an etch rate in the horizontal direction may be adjusted based on one or more of a flow rate of an etch gas, pressure, an etch time, and a flow rate of a passivation gas. For example, the etch rate in the horizontal direction may be increased by increasing at least one of the flow rate of the etch gas, the pressure, and the etch time. The etch rate in the horizontal direction may be increased by decreasing the flow rate of the passivation gas. Accordingly, the fourth recesses R4 may be formed.

Figure 9A:
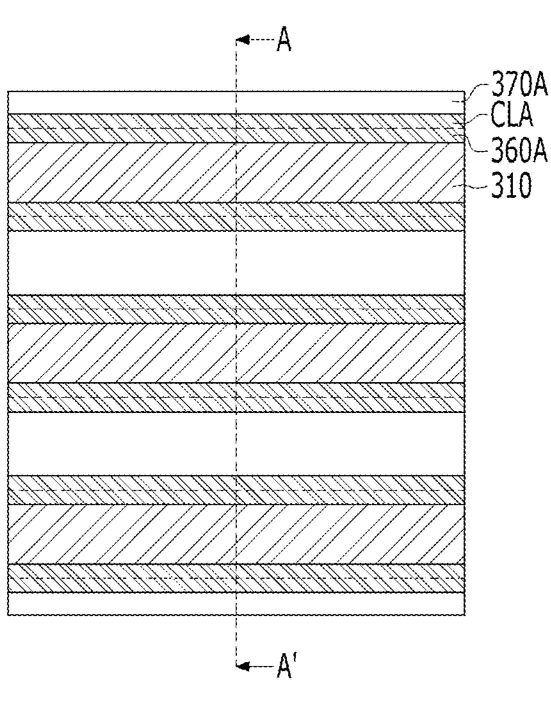
Figure 9A:
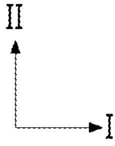
Figure 9B:
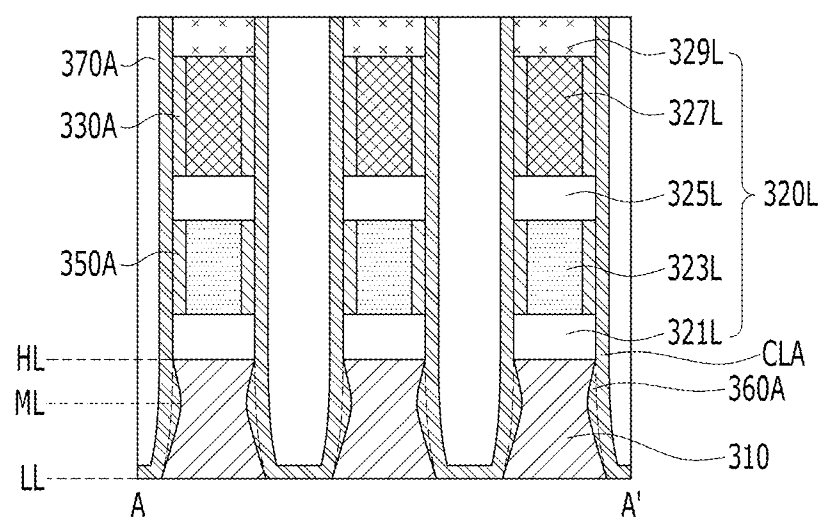

Referring to FIGS. 9A and 9B, fourth liner layers 360A may be formed to fill the fourth recesses R4, respectively. Capping layers CLA may be conformally formed along profiles of the memory lines 320L and the first conductive lines 310. For example, the capping layers CLA may extend in the third direction III and cover sidewalls of the first conductive lines 310 and sidewalls of the memory lines 320L. In this case, the capping layers CLA that are formed to fill the fourth recesses R4 may be defined as the fourth liner layers 360A. The fourth liner layers 360A may include an insulating material, such as a nitride or an oxide. For example, the fourth liner layers 360A may include a silicon nitride.

Next, first gap-fill layers 370A may each be formed between the memory lines 320L that are adjacent to each other in the second direction II. The first gap-fill layers 370A may be formed to fill spaces between the memory lines 320L after forming the capping layers CLA along the profiles of the memory lines 320L and the first conductive lines 310. The first gap-fill layers 370A may include an insulating material, such as an oxide or a nitride.

Figure 10A:
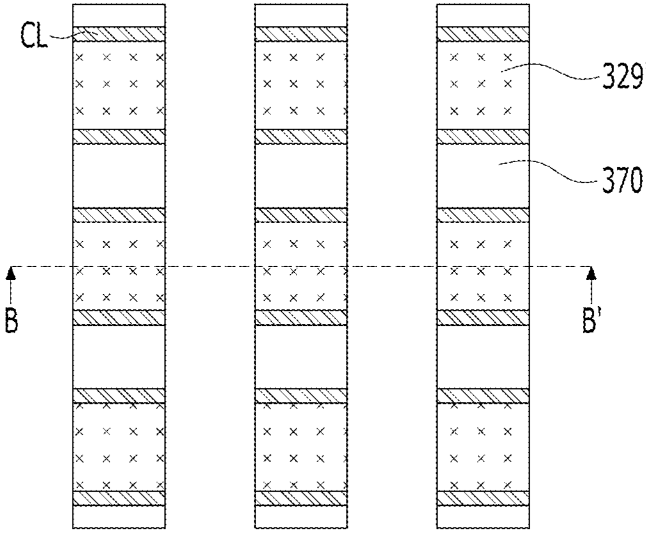
Figure 10A:
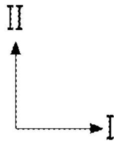
Figure 10B:
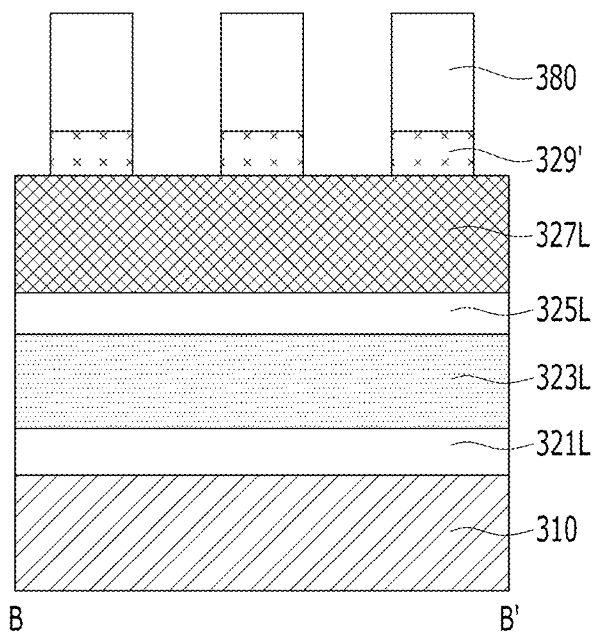
Figure 10B:
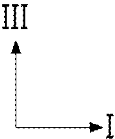

Referring to FIGS. 10A and 10B, second conductive lines 380 that extend in the second direction II may be formed. The second conductive lines 380 may be spaced apart from each other in the first direction I. First, a second conductive layer may be formed on the memory lines 320L after forming the first gap-fill layers 370A.

For example, the second conductive layer may be formed on the third electrode lines 329L. Next, the second conductive lines 380 that extend in the second direction II may be formed by etching the second conductive layer. In this case, the second conductive lines 380 may be a word line or a bit line. For example, if the first conductive line 310 is a word line, the second conductive line 380 may be a bit line. As another example, if the first conductive line 310 is a bit line, the second conductive line 380 may be a word line. The second conductive line 380 may include a conductive material. For example, the second conductive line 380 may include a metal, such as tungsten.

Next, preliminary third electrode patterns 329' may be formed by etching the third electrode lines 329L of the memory lines 320L. The preliminary third electrode pattern 329' may include a metal, a metal nitride, carbon, or a carbon nitride.

For reference, in the process of forming the second conductive lines 380 and the preliminary third electrode patterns 329', the first gap-fill layer 370A extending in the first direction I may be divided into a plurality of first gap-fill patterns 370. The first gap-fill patterns 370 may each be disposed between the preliminary third electrode patterns 329' that are adjacent to each other in the second direction II. Furthermore, the capping layer CLA extending in the first direction I may be divided into a plurality of capping patterns CL. The capping patterns CL may each be disposed between the preliminary third electrode patterns 329' that are adjacent to each other in the second direction II. For example, the capping patterns CL may each be disposed between the first gap-fill pattern 370 and the preliminary third electrode pattern 329'.

Figure 11A:
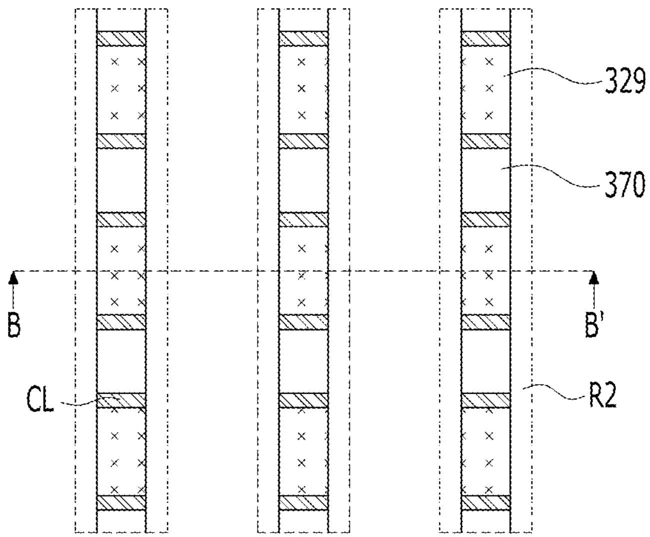
Figure 11A:
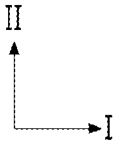
Figure 11B:
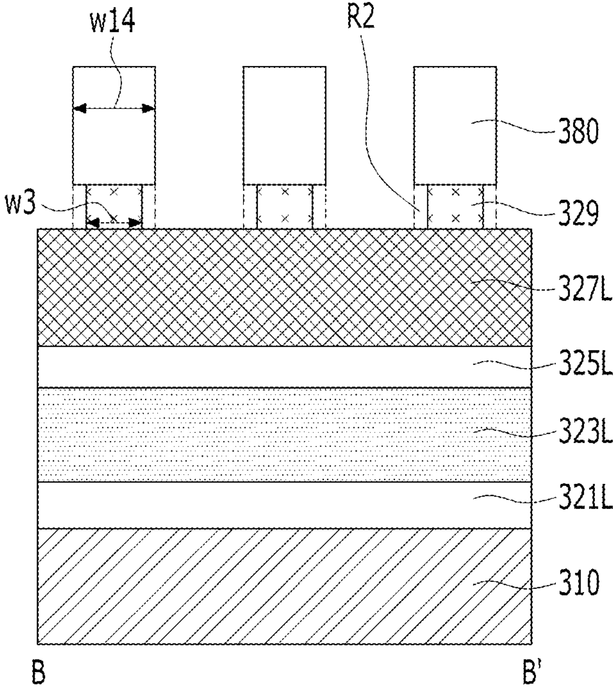
Figure 11B:
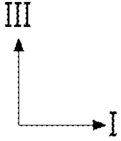

Referring to FIGS. 11A and 11B, the preliminary third electrode patterns 329' may be etched to form second recesses R2. For example, the third electrode lines 329L may be further etched in the horizontal direction to form third electrode patterns 329 after being etched in the vertical direction to form the preliminary third electrode patterns 329'. In such a case, in a cross section defined in the first direction I and the third direction III, the third electrode pattern 329 may have a narrower width than the second conductive line 380, and the second recesses R2 may be formed at both sides of the third electrode pattern 329 in the first direction I. For example, when etching the third electrode lines 329L in the horizontal direction to form the second recesses R2, at least one of a flow rate of an etch gas, pressure, and an etch time may be increased compared to the step of etching the third electrode lines 329L in the vertical direction. Accordingly, the second recesses R2 may be formed by increasing an etch rate in the horizontal direction. Accordingly, the third electrode patterns 329 and the second recesses R2 may be formed by further etching the third electrode lines 329L in the horizontal direction. The third electrode pattern 329 may be an upper electrode of a memory cell.

As the second recesses R2 are formed at both sides of the third electrode pattern 329, the third electrode patterns 329 may each have a third width w3 in the first direction I. The second recesses R2 may each have a width of 50% to 90% of a fourteenth width w14 of the second conductive line 380 in the first direction I. The reason for this is that if the third width w3 is less than 50% of the fourteenth width w14, it is apprehended that the memory lines 320L may slant or collapse.

The third electrode pattern 329 can reduce a reset current of a memory element. For example, since the third width w3 of the third electrode pattern 329 in the first direction I is smaller than the fourth width w4 of the third electrode pattern 329 in the second direction II, resistance of the third electrode pattern 329 may be greater and an amount of heat generated in the third electrode pattern 329 may be greater, compared to a case in which the third width w3 is substantially the same as the fourth width w4. Accordingly, when a reset operation is performed in the memory cell, the reset current can be decreased.

Figure 12A:
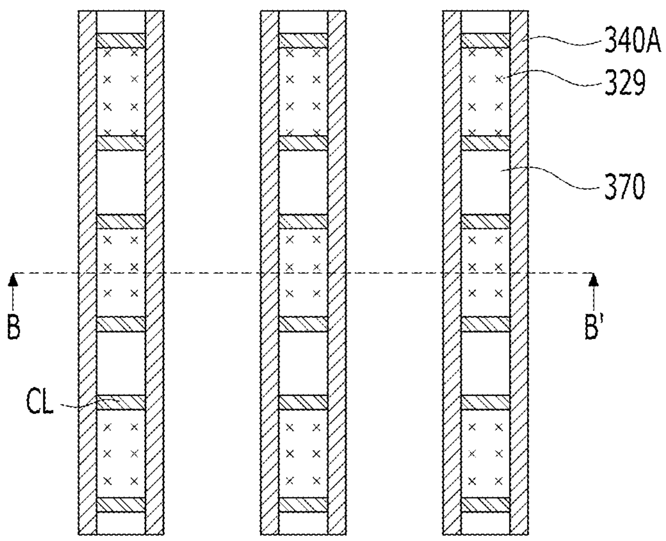
Figure 12A:
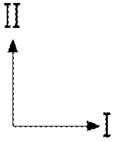
Figure 12B:
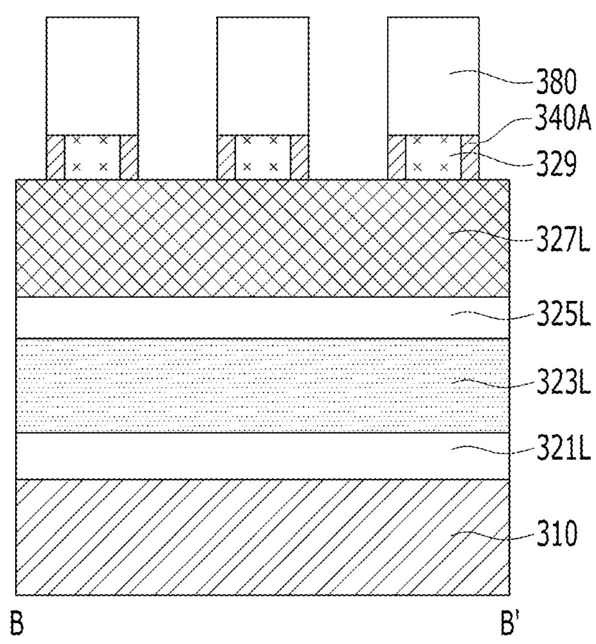
Figure 12B:
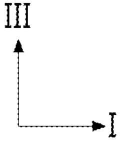

Referring to FIGS. 12A and 12B, second liner layers 340A may be formed to fill the second recesses R2, respectively. First, preliminary second liner layers may be conformally formed along profiles of the second conductive lines 380 and the third electrode patterns 329. Next, the second liner layers 340A may be formed to fill the second recesses R2 by etching the preliminary second liner layers. The second liner layers 340A may each have a width corresponding to a half of a difference between the fourteenth width w14 and the third width w3, i.e., ½(w14−w3). The second liner layers 340A may include an insulating material, such as a nitride or an oxide. For example, the second liner layers 340A may include a silicon nitride.

Figure 13A:
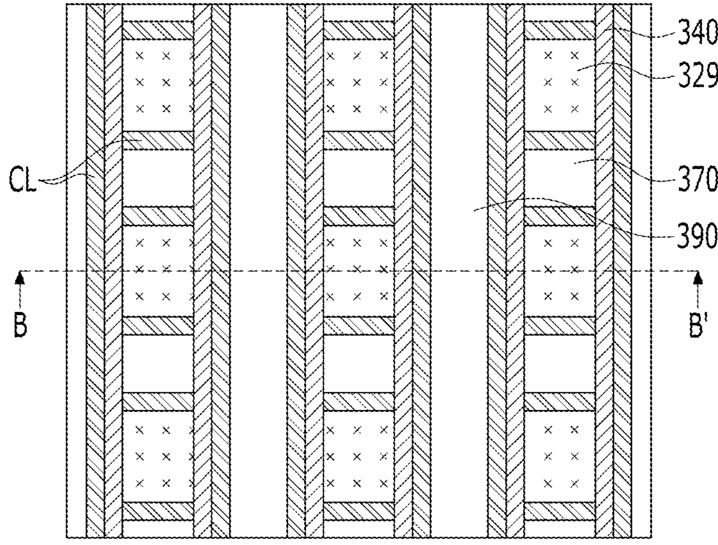
Figure 13A:
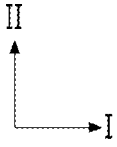
Figure 13B:
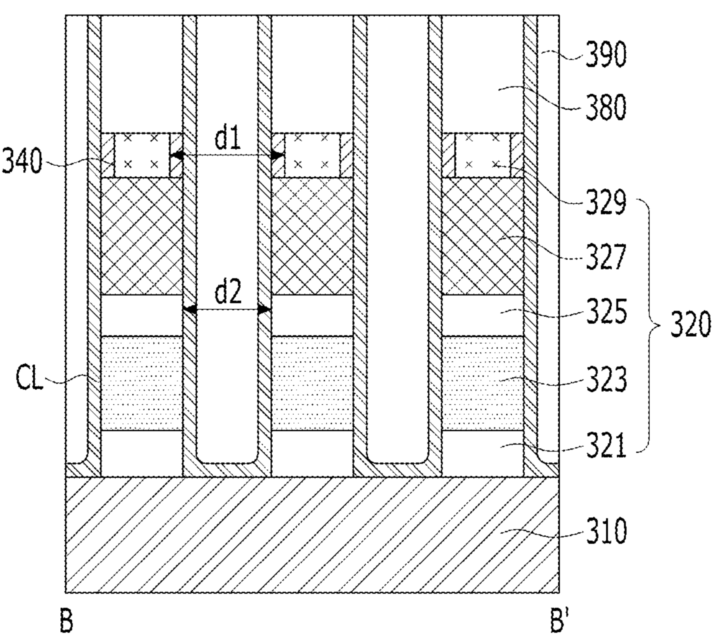
Figure 13B:
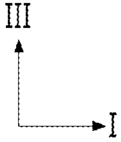

Referring to FIGS. 13A and 13B, memory cells 320 may be formed by etching the memory lines 320L. For example, a variable resistance pattern 327, a second electrode pattern 325, a switching pattern 323, and a first electrode pattern 321 may be formed by sequentially etching the variable resistance line 327L, the second electrode line 325L, the switching line 323L, and the first electrode line 321L until a top surface of the first conductive line 310 is exposed. Accordingly, the memory cell 320 including the first electrode pattern 321, the switching pattern 323, the second electrode pattern 325, the variable resistance pattern 327, and the third electrode pattern 329 may be defined.

Since the third electrode pattern 329 has the third width w3 that is relatively small, a first distance d1 can be secured between the third electrode patterns 329 that are adjacent to each other in the first direction I. The first distance d1 may be different from a second distance d2 between the second electrode patterns 325 that are adjacent to each other in the first direction I. For example, the first distance d1 may be greater than the second distance d2. Accordingly, a distance margin between the third electrode patterns 329 can be secured in the first direction I.

In the process of forming the memory cell 320, the first liner layers 330A, the third liner layers 350A, and the capping layers CLA that extend in the first direction I may be divided into first liner patterns, third liner patterns, and capping patterns CL, respectively. In this case, the fourth liner layers 360A may be divided into fourth liner patterns.

The first liner patterns may be disposed on sidewalls of the variable resistance pattern 327 that face the first liner patterns in the second direction II. The third liner patterns may be disposed on sidewalls of the switching pattern 323 that face the third liner patterns in the second direction II. The fourth liner patterns may be disposed on sidewalls of the first conductive line 310 that face the fourth liner patterns in the second direction II. In such a case, the aforementioned structures that have been described with reference to FIGS. 1A to 1E may be implemented.

Next, second gap-fill patterns 390 may each be formed between the memory cells 320 that are adjacent to each other in the first direction I. For reference, after the second gap-fill patterns 390 are formed, the second liner layers 340A may be referred to as second liner patterns 340. The second liner patterns 340 may be disposed on the sidewalls of the third electrode pattern 329 that face the second liner patterns 340 in the first direction I. Furthermore, before the second gap-fill patterns 390 are formed, capping patterns CL may each be formed along profiles of the second conductive lines 380, the memory cells 320, and the top surface of the first conductive line 310 between the memory cells 320 that are adjacent to each other in the first direction I. In this case, the capping patterns CL may be substantially the same as or different from the capping patterns CL that are each formed between the memory cells 320 that are adjacent to each other in the second direction II.

In another embodiment, after the second liner layers 340A are formed, sixth liner layers may be formed on the sidewalls of the variable resistance pattern 327. First, the variable resistance line 327L may be etched in the vertical direction and may also be etched in the horizontal direction to form sixth recesses. Next, the sixth liner layers may be formed to fill the sixth recesses, respectively. Likewise, seventh liner layers may be formed on sidewalls of the switching pattern 323. The sixth liner layers and the seventh liner layers may be referred to as sixth liner patterns and seventh liner patterns, respectively. In such a case, the aforementioned structures that have been described with reference to FIGS. 2A to 2C may be implemented.

According to the aforementioned processes, in the process of forming the memory cells 320, the recesses R1, R2, R3, and R4 may be formed as the etching is performed to form the third electrode pattern 329, the variable resistance pattern 327, the switching pattern 323, and the first conductive line 310 in the vertical direction and the horizontal direction. The liner patterns may be formed within the recesses R1, R2, R3, and R4. Accordingly, the third electrode pattern 329, the variable resistance pattern 327, the switching pattern 323, and the first conductive line 310 can be protected by the liner patterns in a process of manufacturing the semiconductor device. As a result, the danger of the memory cells 320 slanting or collapsing can be prevented or minimized.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:

a word line that extends in a first direction;

a bit line that extends in a second direction that intersects the first direction;

a variable resistance pattern disposed between the word line and the bit line in a third direction that is perpendicular to the first and the second directions, the variable resistance pattern having a first width in the first direction and a second width in the second direction, wherein the first width and the second width are different from each other; and an electrode pattern disposed between the variable resistance pattern and the bit line in the third direction, the electrode pattern having a third width in the first direction and a fourth width in the second direction, wherein the third width and the fourth width are different from each other.

2. The semiconductor device of claim 1, further comprising first liner patterns disposed on sidewalls of the variable resistance pattern that face the first liner patterns in the second direction.

3. The semiconductor device of claim 1, further comprising second liner patterns disposed on sidewalls of the electrode pattern that face the second liner patterns in the first direction.

4. The semiconductor device of claim 1, wherein the word line has a high level, a middle level, and a low level in the third direction, the middle level disposed between the high level and the low level, the word line having a seventh width at the high level, an eighth width at the middle level, and a ninth width at the low level.

5. The semiconductor device of claim 4, wherein the eighth width is smaller than the seventh width.

6. The semiconductor device of claim 4, wherein the ninth width is greater than the seventh width.

7. The semiconductor device of claim 1, wherein the second width is smaller than the first width.

8. The semiconductor device of claim 1, wherein the third width is smaller than the fourth width.

9. The semiconductor device of claim 1, further comprising a switching pattern disposed between the word line and the variable resistance pattern in the third direction, the switching pattern having a fifth width in the first direction and a sixth width in the second direction, wherein the sixth width is smaller than the fifth width.

10. The semiconductor device of claim 9, further comprising third liner patterns disposed on sidewalls of the switching pattern that face the third liner patterns in the second direction.

11. The semiconductor device of claim 1, wherein the electrode pattern comprises:

a first part having the third width in the first direction and the fourth width in the second direction; and a second part having a tenth width in the first direction and an eleventh width in the second direction, wherein the first part is disposed on the second part in the third direction.

12. The semiconductor device of claim 11, wherein the tenth width is substantially identical with the eleventh width.

13. The semiconductor device of claim 1, further comprising fourth liner patterns disposed on sidewalls of the word line that face the fourth liner patterns in the second direction.

* * * * *